United States Patent
Pan et al.

(10) Patent No.: US 12,464,737 B2
(45) Date of Patent: Nov. 4, 2025

(54) POLYSILICON RESISTORS WITH HIGH SHEET RESISTANCE

(71) Applicant: Texas Instruments Incorporated, Dallas, TX (US)

(72) Inventors: Yanbiao Pan, Plano, TX (US); Pushpa Mahalingam, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 344 days.

(21) Appl. No.: 17/828,891

(22) Filed: May 31, 2022

(65) Prior Publication Data

US 2022/0399434 A1   Dec. 15, 2022

Related U.S. Application Data

(60) Provisional application No. 63/210,719, filed on Jun. 15, 2021.

(51) Int. Cl.
*H10D 1/47*     (2025.01)
*H01L 21/265*   (2006.01)
*H10D 62/40*    (2025.01)
*H10D 62/834*   (2025.01)

(52) U.S. Cl.
CPC ........ *H10D 1/47* (2025.01); *H01L 21/26513* (2013.01); *H01L 21/26586* (2013.01); *H10D 62/40* (2025.01); *H10D 62/834* (2025.01)

(58) Field of Classification Search
None
See application file for complete search history.

(56) References Cited

U.S. PATENT DOCUMENTS

| 2006/0035426 A1* | 2/2006 | Weiss | H10D 84/209 |
| | | | 257/E27.047 |
| 2012/0108020 A1* | 5/2012 | Baldwin | H01L 21/265 |
| | | | 700/121 |
| 2013/0200466 A1* | 8/2013 | Zhao | H10D 84/811 |
| | | | 257/E27.06 |
| 2022/0238631 A1* | 7/2022 | Zierak | H01L 21/76283 |

OTHER PUBLICATIONS

B.J. Pawlak et al., "Suppression of Phosphorus Diffusion by Carbon Co-implantation", Applied Physics Letters 89, 062102 (Aug. 7, 2006).

Chung-Hui Chen et al., "Nitrogen Implanted Polysilicon Resistor for High-Voltage CMOS Technology Application", EEE Electron Device Letters, vol. 22, No. 11 (Nov. 2001), pp. 524-526.

\* cited by examiner

*Primary Examiner* — Ajay Ojha
*Assistant Examiner* — Pinaki Das
(74) *Attorney, Agent, or Firm* — Andrew R. Ralston; Frank D. Cimino

(57) ABSTRACT

An integrated circuit includes a dielectric isolation structure formed at a surface of a semiconductor substrate and a polysilicon resistor body formed on the dielectric isolation structure. The polysilicon resistor body includes an N-type dopant having an N-type dopant concentration, nitrogen having a nitrogen concentration, and carbon having a carbon concentration. The sheet resistance of the resistor body is greater than 5 kΩ/square.

20 Claims, 8 Drawing Sheets

POLYSILICON RESISTORS WITH HIGH SHEET RESISTANCE

BACKGROUND

Two parameters of polysilicon resistors—resistance and matching coefficient—tend to be inversely related: increasing the resistance generally decreases the matching coefficient causing greater mismatch of nominally identical resistors across a wafer, within a wafer lot, and from lot to lot. For ultra-high sheet resistance (UHRES) resistors, some integrated circuits use p-type boron-doped resistors due to relatively low matching coefficient, but the resistance of such resistors may drift over time due to diffusion of the boron.

SUMMARY

Disclosed implementations provide an integrated circuit with a polysilicon resistor having an ultra-high sheet resistance (UHRES), e.g., greater than 5 k$\Omega$/square. The UHRES resistor is implanted with phosphorus or arsenic and also with nitrogen and carbon, which improve the resistance and the matching coefficient. The UHRES implantation process may also be provided to other polysilicon resistors, such as high sheet resistance (HSR) resistors, at the same time to improve the matching coefficient of the resistors. Dilution doping may be used in conjunction with either the HSR resistors or the UHRES resistors so that the level of nitrogen and carbon does not need to be the same in the UHRES resistors and the HSR resistors.

In one aspect, an implementation of an integrated circuit is disclosed. The integrated circuit includes a resistor having a polysilicon resistor body over a semiconductor substrate. The polysilicon resistor body contains an N-type dopant and carbon and nitrogen dopants.

In another aspect, an implementation of a method of fabricating an integrated circuit is disclosed. The method includes forming a polysilicon resistor body over a semiconductor substrate and implanting an N type dopant, nitrogen and carbon into the polysilicon resistor body.

BRIEF DESCRIPTION OF THE DRAWINGS

Implementations of the present disclosure are illustrated by way of example, and not by way of limitation, in the figures of the accompanying drawings in which like references indicate similar elements. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary implementations of the present disclosure. Various advantages and features of the disclosure will be understood from the following Detailed Description taken in connection with the appended claims and with reference to the attached drawing figures in which:

DETAILED DESCRIPTION

Specific implementations will now be described in detail with reference to the accompanying figures. In the following detailed description of implementations, numerous specific details are set forth in order to provide a more thorough understanding of the disclosure. However, it will be apparent to one of ordinary skill in the art that other implementations may be practiced without these specific details. In other instances, well-known features have not been described in detail to avoid unnecessarily complicating the description.

Various disclosed methods and devices of the present disclosure may be beneficially applied to ultra-high sheet resistance resistors employed in integrated circuits. Various implementations may provide resistors with low drift, low matching coefficient and low temperature coefficient of resistance while providing a sheet resistance exceeding 5 k$\Omega$/☐. While such embodiments may be expected to provide stable resistors that provide a high resistance in a small device area, no particular result is a requirement unless explicitly recited in a particular claim.

Figure 5:
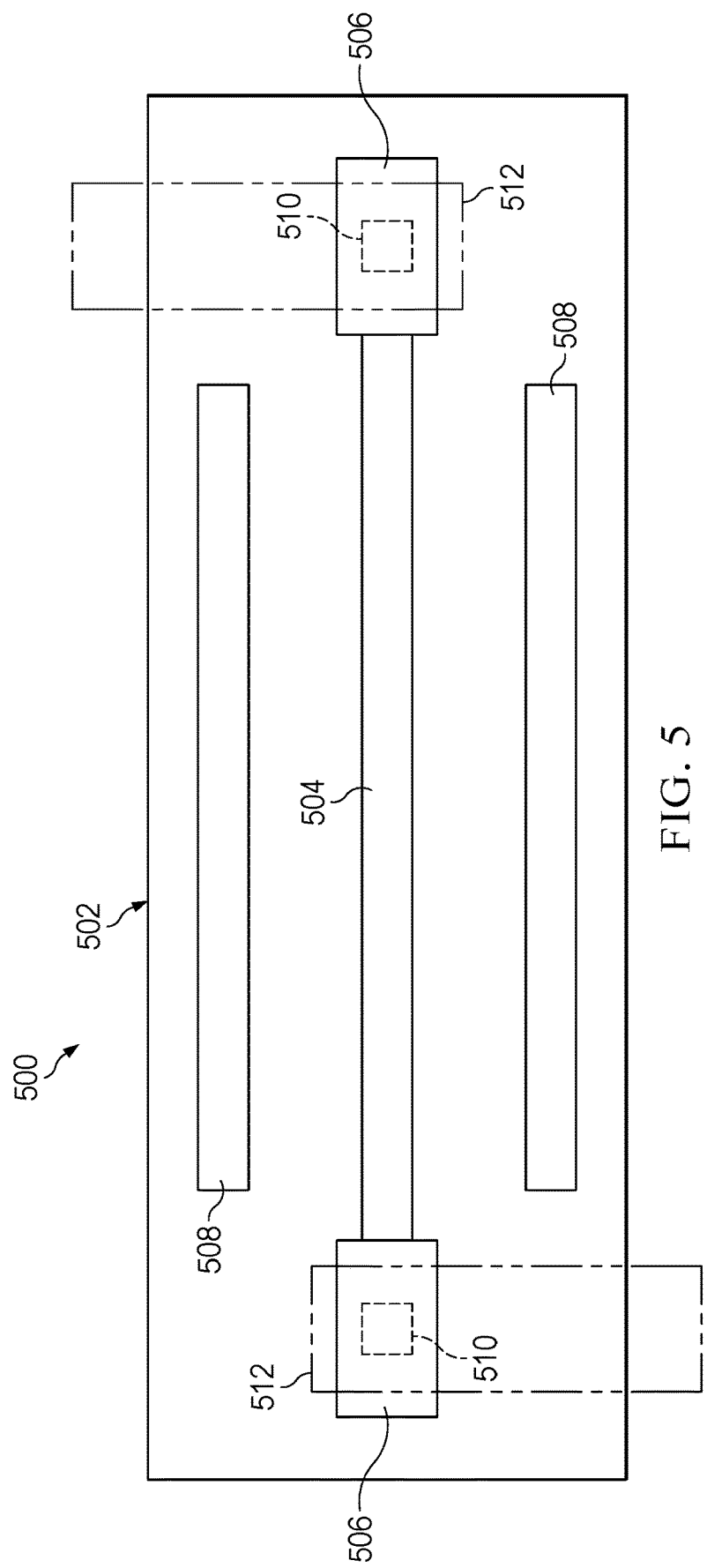
FIG. 5 depicts a plan view of a polysilicon resistor that may be used in an implementation of the disclosure.

FIG. 5 depicts a plan view of a polysilicon resistor 500 according to various examples of the disclosure that may be implemented as an ultra-high sheet resistance (UHRES) resistor. As used herein a UHRES resistor has a sheet resistance greater than 5 k$\Omega$. The polysilicon resistor 500 may be formed on a dielectric structure 502 that has been formed in the surface of a semiconductor substrate. In one implementation, the dielectric structure 502 may be a shallow trench isolation (STI) structure. In another implementation, the dielectric structure 502 may be a local oxidation of silicon (LOCOS) structure. The polysilicon resistor 500 includes a resistor body 504 and resistor heads 506 formed on the dielectric structure 502. Dummy polysilicon fingers 508 may also be formed on the dielectric structure 502. The resistor body 504 may be doped to achieve a desired resistance, while the resistor heads 506 may receive either a P-type source/drain (PSD) implant or an N-type source/drain (NSD) implant. Contacts 510, shown in dotted lines, may extend upward from the resistor heads 506 to a first metallization level 512, which is also shown in dotted lines.

In baseline devices (e.g. integrated circuits) implementing an HSR resistor and a UHRES resistor, the HSR resistor includes an N-type dopant, e.g., phosphorus or arsenic, which has been implanted into a polysilicon resistor body. Such N-type dopants are thought to have better resistance to drift than a P-type dopant such as boron. While such dopant stability is desirable, some such phosphorus-doped UHRES resistors have been found to be unable to meet other requirements, such as a sufficiently low temperature coefficient of resistance (TCR) and a sufficiently low matching coefficient. As a result, UHRES resistors using boron have been used in some designs. Such resistors may have low TCR and matching coefficient, but may also be subject to dopant drift effects due to the relatively high mobility of boron in polysilicon.

The inventors have determined that UHRES resistors may be made that include the benefits of reduced dopant mobility and low TCR and matching coefficient by doping polysilicon with non-electrically active dopants nitrogen (N) and carbon (C). An N-type dopant such as phosphorus or arsenic in the UHRES resistor is understood to provide better resistance to drift, the nitrogen is understood to suppress hydrogen passivation that may degrade the resistor over time, and the carbon and the nitrogen are understood to reduce the TCR and the matching coefficient. Such resistors may have a sheet resistance greater than 5 k$\Omega$/□, and even approach 10 k$\Omega$/□, providing stable resistors with small footprint for reduced device size.

The addition of carbon and nitrogen implants to the UHRES implantation process provides the ability to add the carbon and nitrogen implants to HSR resistors or other polysilicon resistors as well by patterning mask level used for the UHRES C/N implants to provide suitable openings to additionally dope the HSR resistors with carbon and nitrogen. The carbon and nitrogen may provide the similar benefits to the HSR resistors that are described for the UHRES resistors, e.g., improved matching coefficient and improved temperature coefficient.

Figure 1A:
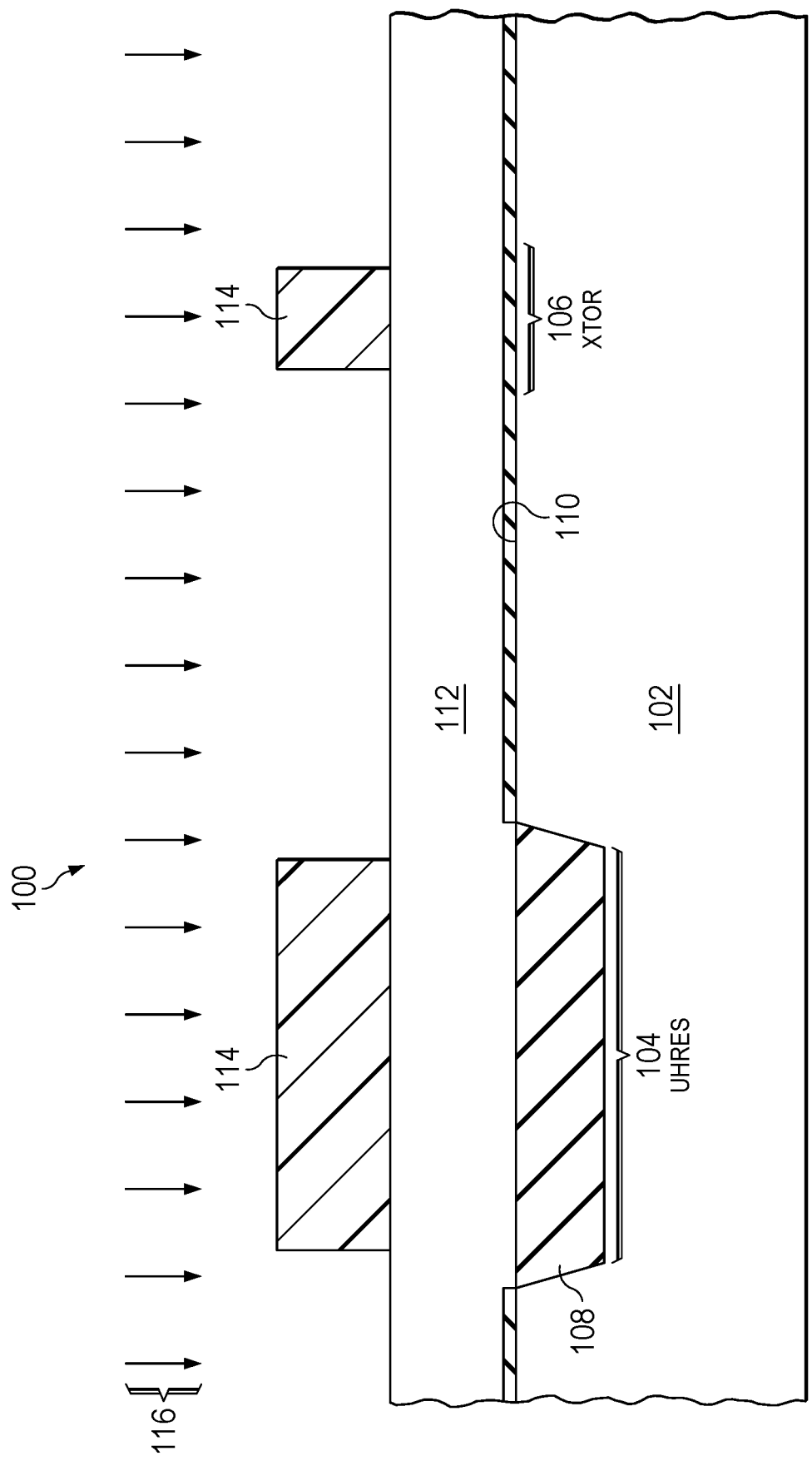
FIGS. 1A-1D depict stages in the fabrication of an integrated circuit containing an ultra-high sheet resistance (UHRES) resistor according to an implementation of the disclosure.

FIGS. 1A-1D depict various stages during the fabrication of an integrated circuit (IC) 100 formed in and/or over a semiconductor substrate 102. The semiconductor substrate 102 may be bulk silicon and may contain an epitaxial layer (not shown), but may also be silicon on insulator (SOI), silicon on sapphire (SOS), or other substrate, whether currently known or future implemented. The semiconductor substrate 102 may in one example have a P-type doping. The IC 100 includes a UHRES resistor 104 and a transistor 106. In FIG. 1A, a dielectric isolation structure 108, shown as a shallow trench isolation (STI) structure, has been formed at a top surface 110 of the semiconductor substrate 102. Other dielectric isolation structures, such as LOCOS structures or any other type of dielectric isolation structure, may be used. Such structures preferably have a relatively flat surface. A gate oxide layer, such as may be present between a transistor gate and the semiconductor substrate 102 is explicitly excluded from the scope of the term "dielectric isolation structure". The dielectric isolation structure 108 may be formed using known processes, for example for an STI structure including depositing and patterning a photoresist layer (not shown) over the semiconductor substrate 102 to expose regions where the dielectric isolation structures 108 are desired, etching trenches (not shown) into the exposed semiconductor substrate 102, forming a layer of oxide (not shown) over the top surface 110 of the semiconductor substrate 102 to overfill the trenches, and using chemical-mechanical polishing (CMP) to remove oxide portions outside the trenches. Other dielectric structures may also be used, for example a thermally grown oxide such as LOCOS.

As shown in FIG. 1A, an unreferenced oxide layer, that may be a gate dielectric layer, has been grown on the top surface 110 of the semiconductor substrate 102 and a polysilicon layer 112 has been deposited over the gate oxide layer and the dielectric isolation structure 108. Without implied limitation the polysilicon layer may have a thickness of 120 nm±10%. A photoresist layer 114 has been deposited and patterned to protect the regions where polysilicon resistors and polysilicon gates are desired, which includes the regions for the UHRES resistor 104 and the transistor 106. An etch process 116 removes unprotected portions of the polysilicon layer 112, stopping on the dielectric isolation structures 108 and on the gate oxide layer.

Figures 1, 1B:
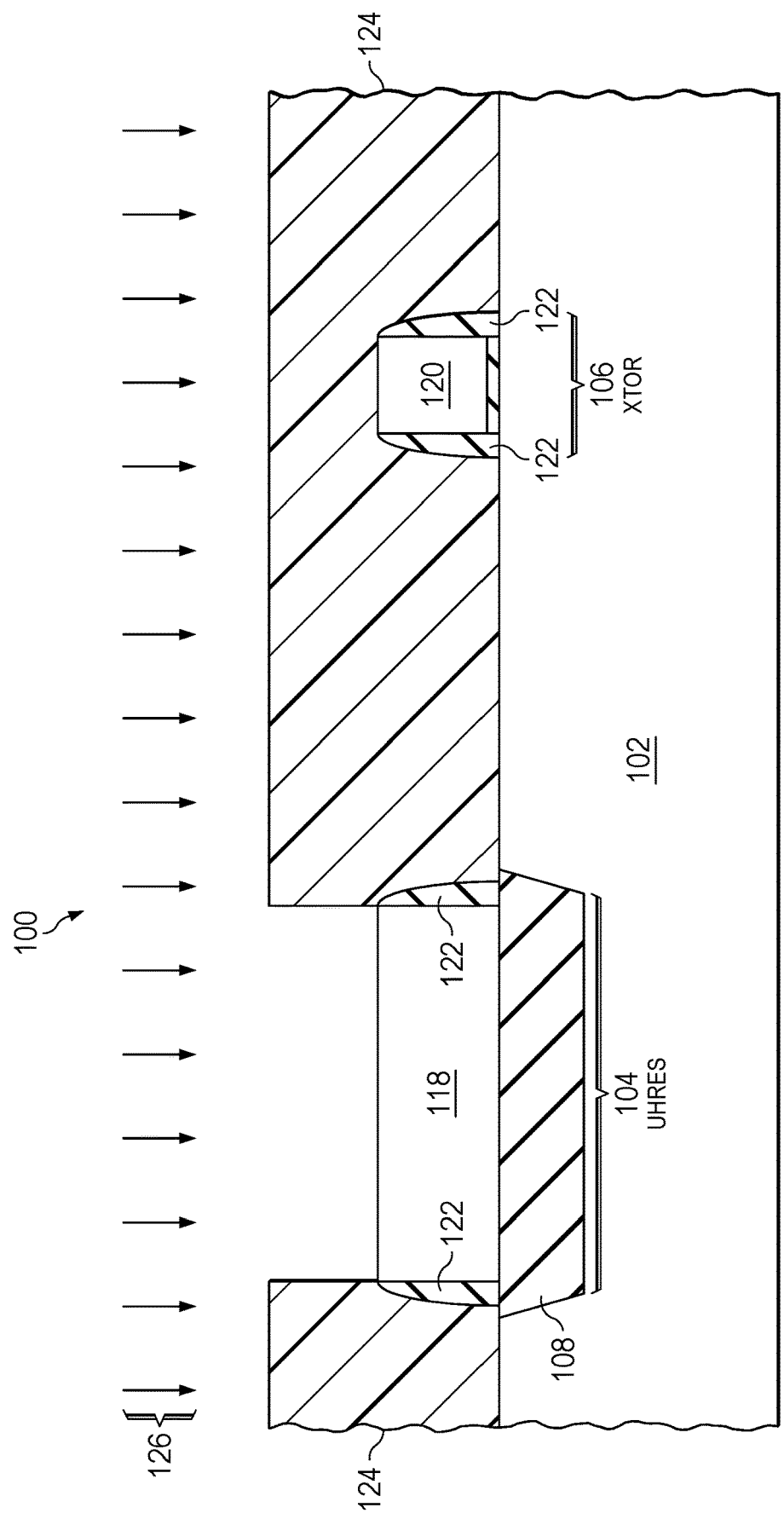
Figures 1, 1B, 2:
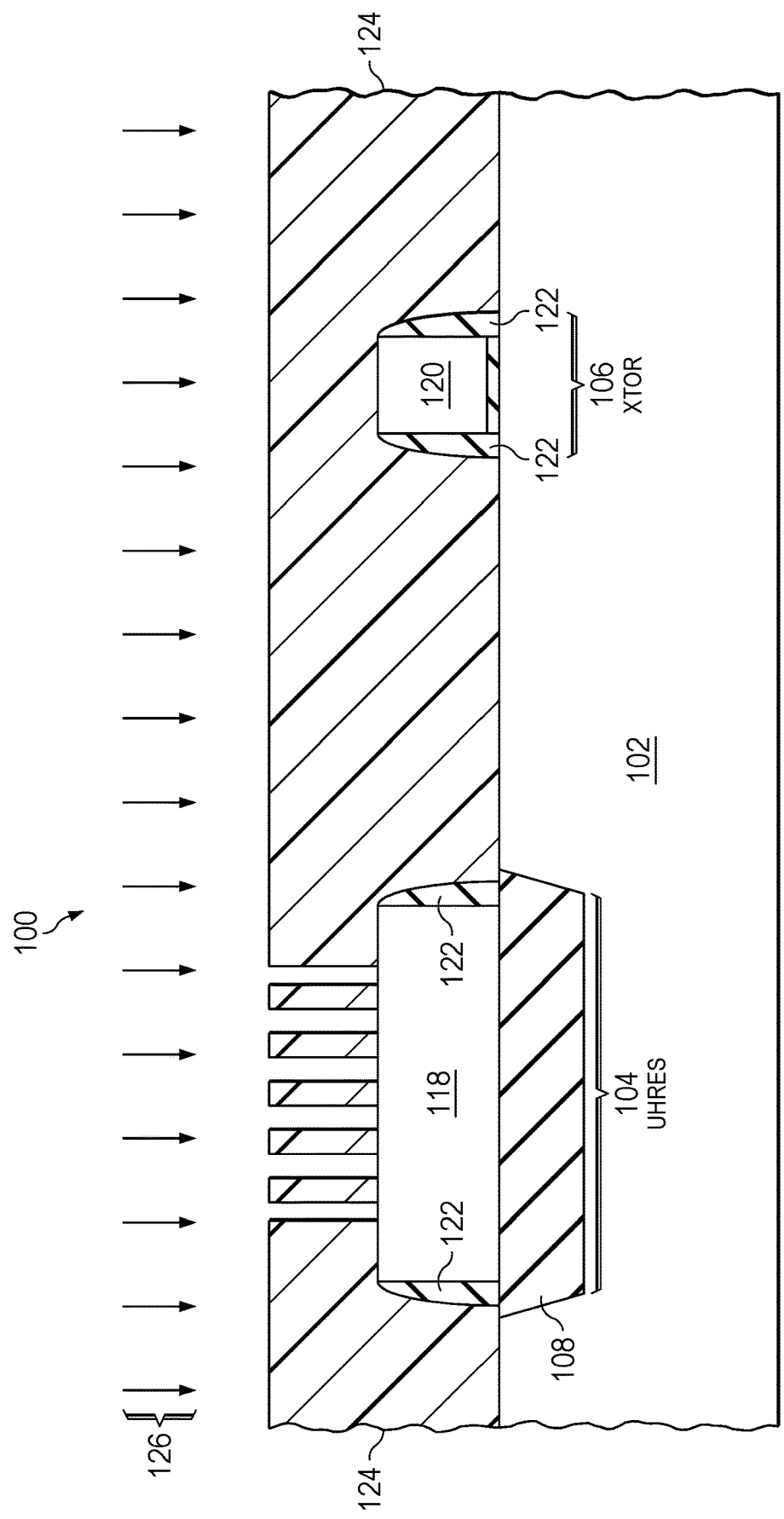
FIG. 2 depicts matching coefficient and sheet resistance of several prototypical polysilicon resistors doped with different dopants at several implant energies and dopant concentrations.

FIG. 1B-1 depicts the integrated circuit 100 after the etch process 116 has been completed, forming a polysilicon resistor structure 118 and a gate electrode 120. Optional dielectric sidewall spacers 122 have also been formed on the side walls of the polysilicon resistor structure 118 and the gate electrode 120. A photoresist layer 124 has been deposited and patterned to selectively expose the polysilicon resistor structure 118 to an implantation process 126 that provides dopants as further described below. In the illustrated example implementation of FIG. 1A, the polysilicon resistor structure 118 is fully exposed such that subsequent added dopants may be implanted uniformly at the surface of the exposed portion. FIG. 1B-2 illustrates another example in which the photoresist layer 124 is patterned such that exposed portions of the polysilicon resistor structure 118 alternate with covered portions, so that the polysilicon resistor structure 118 receives a total dose of the dopants less than the dose provided in FIG. 1B-1. The partial blocking of implant doping is termed "dilution doping" and may be used to create multiple doping levels using a single implantation process by controlling the amount of exposed polysilicon for each resistor.

The implantation process 126 provides an N-type dopant, nitrogen and carbon, each of which may be provided at a corresponding dosage and energy. The N-type dopant dose may establish the sheet resistance $R_s$ of the polysilicon resistor structure 118. The use of an N-type dopant rather than a P-type dopant such as boron is expected to reduce resistance drift that might otherwise occur with the smaller boron atom. In an example implementation of the implantation process 126, the N-type dopant includes phosphorus which may be implanted at a dose of about 6.5 E14 cm$^{-2}$ and an energy of about 30 keV. In other examples the N-type dopant may include arsenic with suitable adjustment of dosage and energy.

The nitrogen dopant is expected to reduce possible diffusion of hydrogen into the polysilicon resistor structure 118 as might occur during an anneal at a later stage of manufacturing. In some examples nitrogen is implanted with a dose about 1.5 times the dose of the N-type dopant. In a specific example nitrogen is implanted at a dose of about 1.0 E15 cm$^{-2}$ and an energy of about 20 keV. In some examples the nitrogen implant is performed with no tilt of the semiconductor substrate 102 with respect to the normal to the top surface 110.

The carbon dopant is expected to suppress diffusion of the N-type dopant that might otherwise occur in the absence of the carbon dopant, e.g. by an anneal at a later stage of manufacturing. In some examples carbon is implanted with a dose about three times the dose of the N-type dopant, or about two times the nitrogen. In a specific example carbon is implanted at a dose of about 2.0E15 cm$^{-2}$ and an energy of about 7 keV. In some examples the carbon implant is performed with a tilt of the semiconductor substrate 102 of about nine degrees with respect to the normal to the top surface 110, with a rotation of the tilt axis about four degrees with respect to a long axis of the polysilicon resistor structure 118. It is expected that the concentrations of the N-type dopant, the nitrogen and the carbon will scale about proportionately with the implant dose. Thus the average concentration of carbon in the polysilicon resistor structure 118 is expected to be about 3× the average concentration of the N-type dopant, and the average concentration of nitrogen in the polysilicon resistor structure 118 is expected to be about 1.5× the average concentration of the N-type dopant. Note that these ratios apply to a polysilicon resistor body 118B described below with respect to FIG. 1C, thus excluding polysilicon resistor heads 118H that may include additional dopants. In the context of implant doses, the term "about" means ±20%. In the context of energy, the term "about" means ±10%. At the completion of the implantation process 126, the photoresist layer 124 is removed.

While examples of the disclosure are not necessarily limited to a particular order of implanting the N-type dopant, the nitrogen and the carbon, it is thought that at least for the case that the N-type dopant is phosphorous it may be advantageous to first implant the phosphorous, then implant the nitrogen, and then implant the carbon. The implant order may be relevant to passivating grain boundaries along which hydrogen may layer otherwise diffuse, and/or stabilizing the location of the phosphorous at the desired depth in the polysilicon.

Figure 1C:
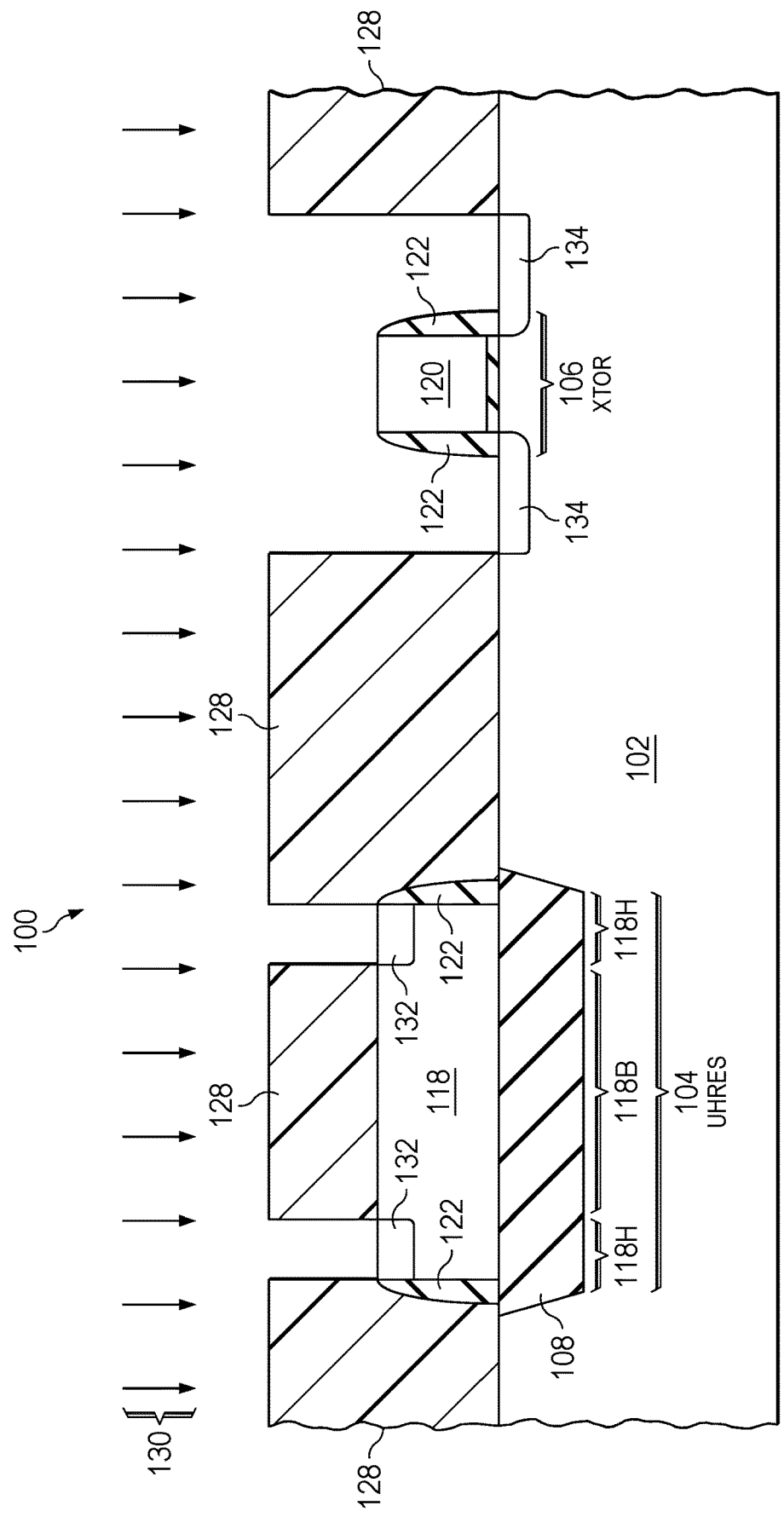

FIG. 1C depicts the integrated circuit 100 at a later stage of manufacturing. A photoresist layer 128 has been deposited and patterned in preparation for an NSD implantation process 130, which in one example includes phosphorus. Openings in the photoresist layer 128 expose the semiconductor substrate 102 adjacent the gate electrode 120 and polysilicon resistor heads 118H to the NSD implantation process 130. A photoresist portion covers a polysilicon resistor body 118B. The NSD implantation process 130 forms n-type resistor head contacts 132 in the polysilicon resistor heads 118H and n-type source/drain regions 134 at the transistor. The NSD implantation process 130 may be any suitable process that results in a charge carrier concentration in the resistor head contacts 132 to provide ohmic contacts to the polysilicon resistor heads 118H, for example 1E20-1 E21 $cm^{-3}$. Following completion of the NSD implantation process 130, the NSD photoresist layer 128 is removed.

Figure 1D:
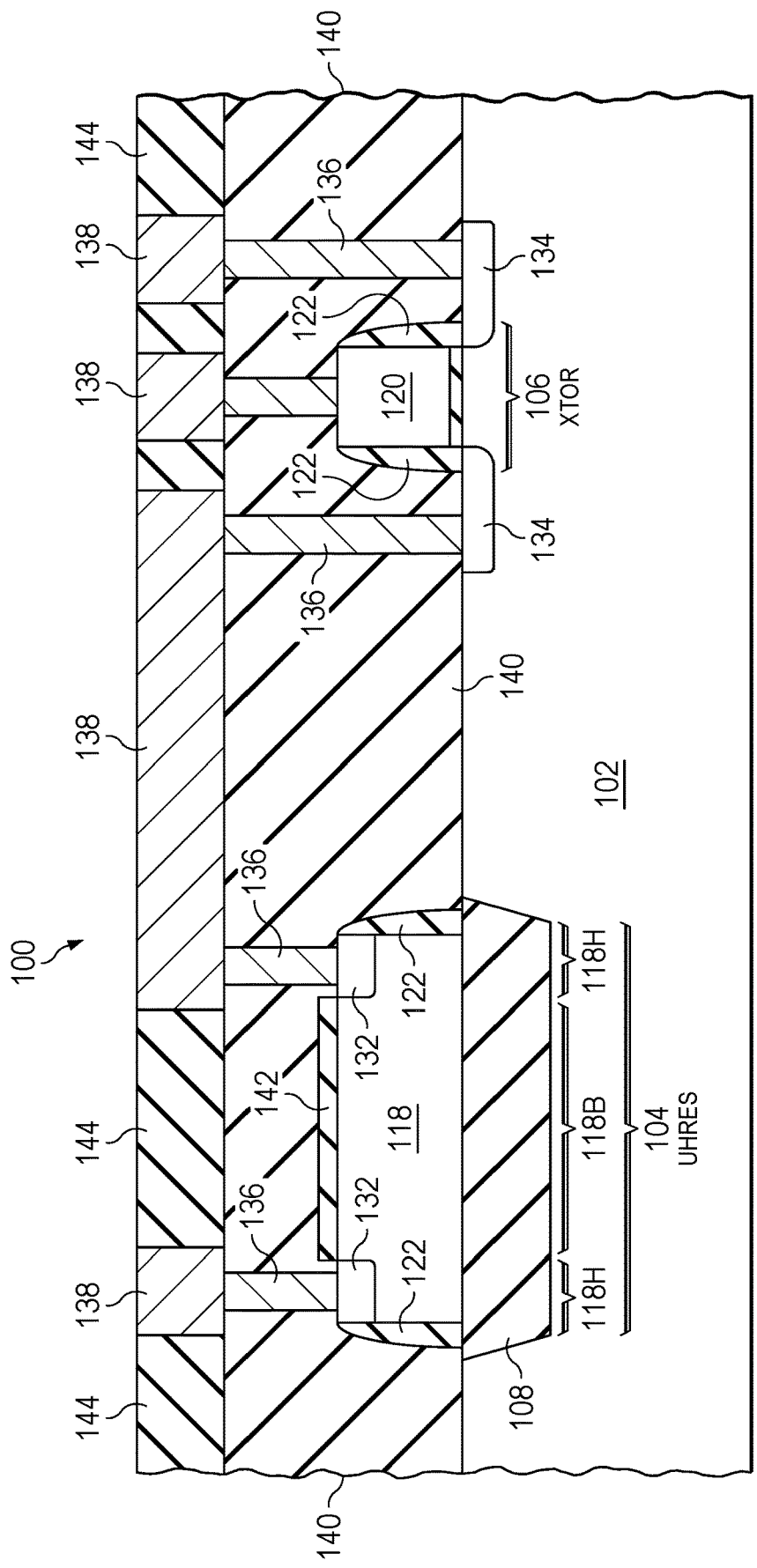
Figure 2:
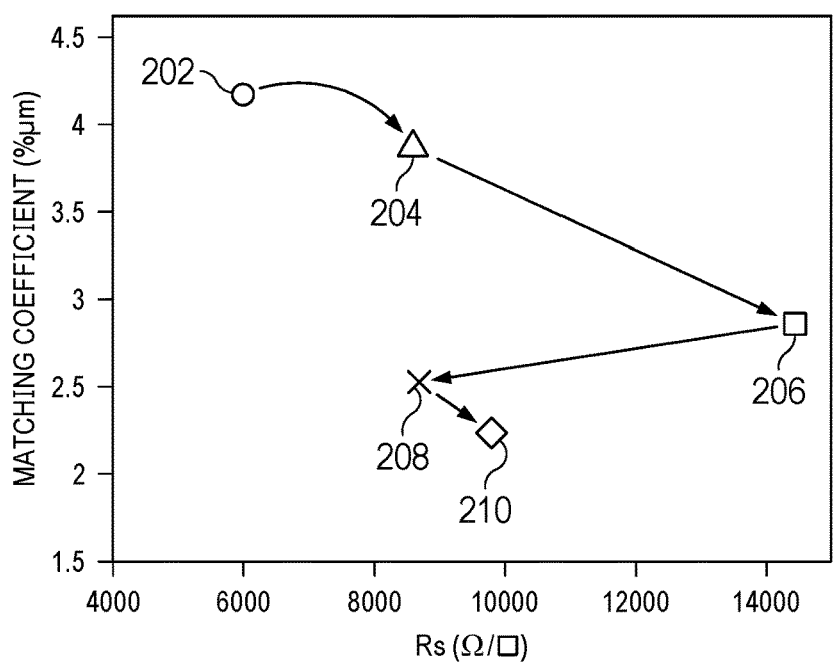

FIG. 1D depicts the IC 100 after forming metal contacts (vertical interconnects) 136 and horizontal interconnects 138 over the semiconductor substrate 102. Contact regions of the IC 100 receive a silicide layer (not specifically shown) to provide ohmic contact with the silicon/polysilicon. Prior to formation of the silicide layer, a silicide-blocking layer 142 is deposited and patterned on the integrated circuit to prevent the formation of silicide where the additional conductivity is not desired, e.g., over the polysilicon resistor body 118B. A pre-metal dielectric layer 140 has been deposited over the integrated circuit 100. The contacts 136 extend through the pre-metal dielectric layer 140 to the polysilicon resistor heads 118H and to the gate electrode 120. A first metal layer METAL-1 has been deposited and patterned to form the horizontal interconnects 138 in a dielectric layer 144 that provide conductive connections from the UHRES resistor 104 to other devices on the integrated circuit 100, for example to a source/drain region 134 of the transistor 106. The dielectric layers 140, 144, contacts 136 and horizontal interconnects 138 are not limited to any particular materials or forming techniques, which may include by way of example and not limitation, e.g. subtractive aluminum etch, copper damascene, one or more metal barrier layers, silicon oxide, silicon nitride and silicon oxynitride.

It is generally desirable that the matching coefficient of the polysilicon resistors formed consistent with the UHRES resistor 104 be as low as possible while meeting other resistor parameter requirements, such as having a sheet resistance greater than 5 kΩ/□. FIG. 2 depicts the matching coefficient determined for formed using different doping protocols. As known to those skilled in the pertinent art, the matching coefficient MC of a population of resistors may be determined by a best-fit line to the standard deviation of resistance for resistors having different areas (width×length) plotted a function of the inverse root of the resistor area. In other words, $\sigma(R)=MC \cdot (area)^{-1/2}$. The matching coefficient is sometimes expressed in units of percent-micron, or %·μm. A smaller value of MC indicates a smaller sensitivity of the resistance of the population of resistors to factors that may undesirably affect the equivalent sheet resistance of the resistors, such as dopant variation and linewidth variation.

In FIG. 2, the matching coefficient is shown in five cases 202, 204, 206, 208, and 210 for populations of test resistors as a function of the sheet resistance of the resistors in each case. At 202 a first resistor population is doped only with 4.5 E14 $cm^{-2}$ phosphorus at an energy of 45 keV, resulting in a matching coefficient of about 4.2%·μm and a sheet resistance of about 6 kΩ/□. At 204 a second resistor population is doped only with the same phosphorus dose, but at an energy of 30 keV, resulting in a matching coefficient of about 3.9%·μm and a sheet resistance of about 8.5 kΩ/□, thus demonstrating a dependence of Rs and MC on the implant energy, at least for this concentration of phosphorous. At 206 a third resistor population is additionally doped with 1 e15 $cm^{-2}$ nitrogen at an energy of about 20 keV, increasing the sheet resistance to about 14 kΩ/□ and reducing the matching coefficient to about 2.8%·μm. At 208 a fourth resistor population is doped with the same nitrogen dose and energy, but the phosphorous dose is increased to 6.5 e14 $cm^{-2}$ with the implant energy reduced to 26 keV. These conditions reduce the sheet resistance to about 8.5 kΩ/□ and the matching coefficient to about 2.5%·μm. Finally, at 210 resistors in a fifth population are again doped with phosphorous at about 6.5 e14 $cm^{-2}$, but the energy is increased to about 30 keV. The nitrogen dose and energy are unchanged with respect to the fourth case (208), and carbon is implanted with a dose of about 2 e15 $cm^{-2}$ at an energy of about 7 keV. The resistors in the fifth case have a sheet resistance of about 9.9 kΩ/□ and a matching coefficient of about 2.25%·μm.

By these results the inventors conclude without implied limitation that 1) moving the peak phosphorous concentration closer to the top surface of the resistor body tends to reduce the mismatch coefficient, and 2) co-implanting nitrogen and carbon tends to further reduce the mismatch coefficient. It is thought that the carbon and nitrogen suppressed hydrogen passivation and suppress phosphorous diffusion, each of which may degrade the stability of the resistor. In some technology implementations matching coefficient and sheet resistance targets may be 2%·μm and 5 kΩ/□, respectively. The fifth case (210) demonstrates that a sheet resistance of about 10 kΩ/□ and a matching coefficient of about 2.25%·μm are achievable by the principles of the present disclosure, providing an excellent solution to the technology target.

Figure 3:
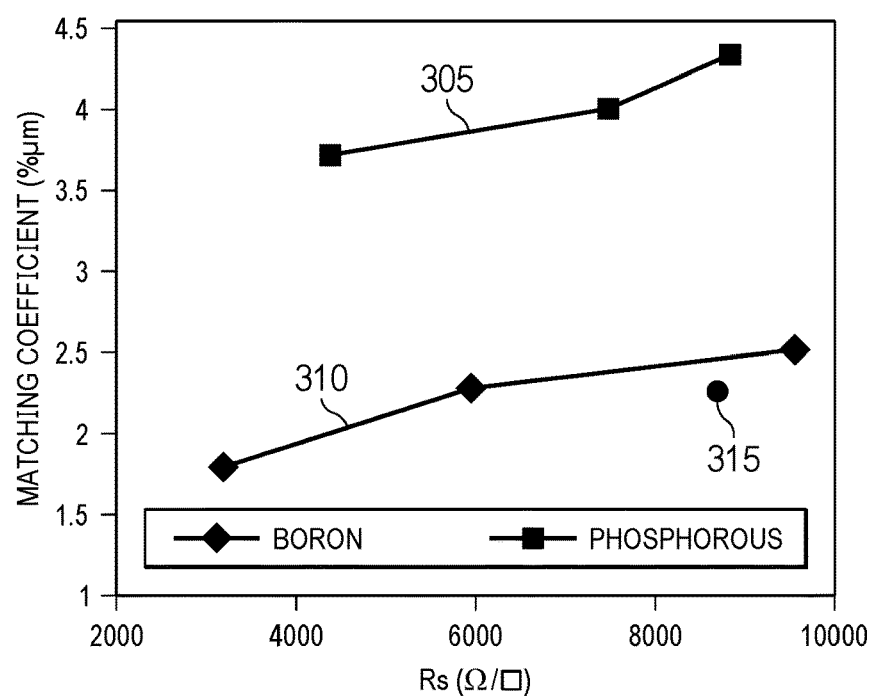
FIG. 3 shows matching coefficient vs. sheet resistance for baseline boron-doped polysilicon resistors, baseline phosphorus-doped polysilicon resistors, and an example UHRES resistor according to the disclosure.

FIG. 3 illustrates the matching coefficients at several values of Rs for baseline polysilicon resistors using phosphorous doping (305) and boron doping (310). While the matching coefficient of the phosphorous-doped resistors is about twice that of the boron-doped resistors, the drift (not shown) is commensurately lower for the phosphorus-doped resistors due to the large size of the dopant atoms. The matching coefficient of an example resistor test set formed according to the principles of the present disclosure is shown at 315 with a matching coefficient of about 2.25%·μm and a sheet resistance of about 9 kΩ/□. This result demonstrates the ability to achieve for UHRES polysilicon resistors a matching coefficient using phosphorous doping that is comparable to the matching coefficient provided by boron doping, but to also realize the advantage of lower drift provided by the phosphorous doping.

The temperature coefficient of resistance (TCR) is another factor of interest for the disclosed resistors and provides a measure of how the resistance changes over temperature. The TCR was determined for polysilicon resistors formed consistent with the example of FIGS. 1A-1D, and first and second order coefficients derived from the empirical results. These coefficients provide a TCR at 25° C. of about −0.4%/° C. (−0.00388%/° C. or −3880 ppm/° C.). At 55° C., the TCR is about −0.3%/° C. (−0.00304%/° C. or −3040 ppm/° C.). UHRES resistors with a TCR near these values may be combined with a diffusion resistor having a positive TCR to achieve a combined resistor have a TCR small enough to meet design requirements.

The drift of the resistance is another factor of interest for the disclosed resistors and provides a measure of how the resistance changes, or drifts, over time. Such first was determined by aging a population of resistors formed consistent with the example of FIGS. 1A-1D at 150° C. for 168 hours. The median drift of resistance for this test population was about −0.1%, as compared to a drift of about 0.7% for a baseline population. Thus the UHRES resistors according to the disclosure provide significantly reduced drift, at least under test conditions.

Figure 4:
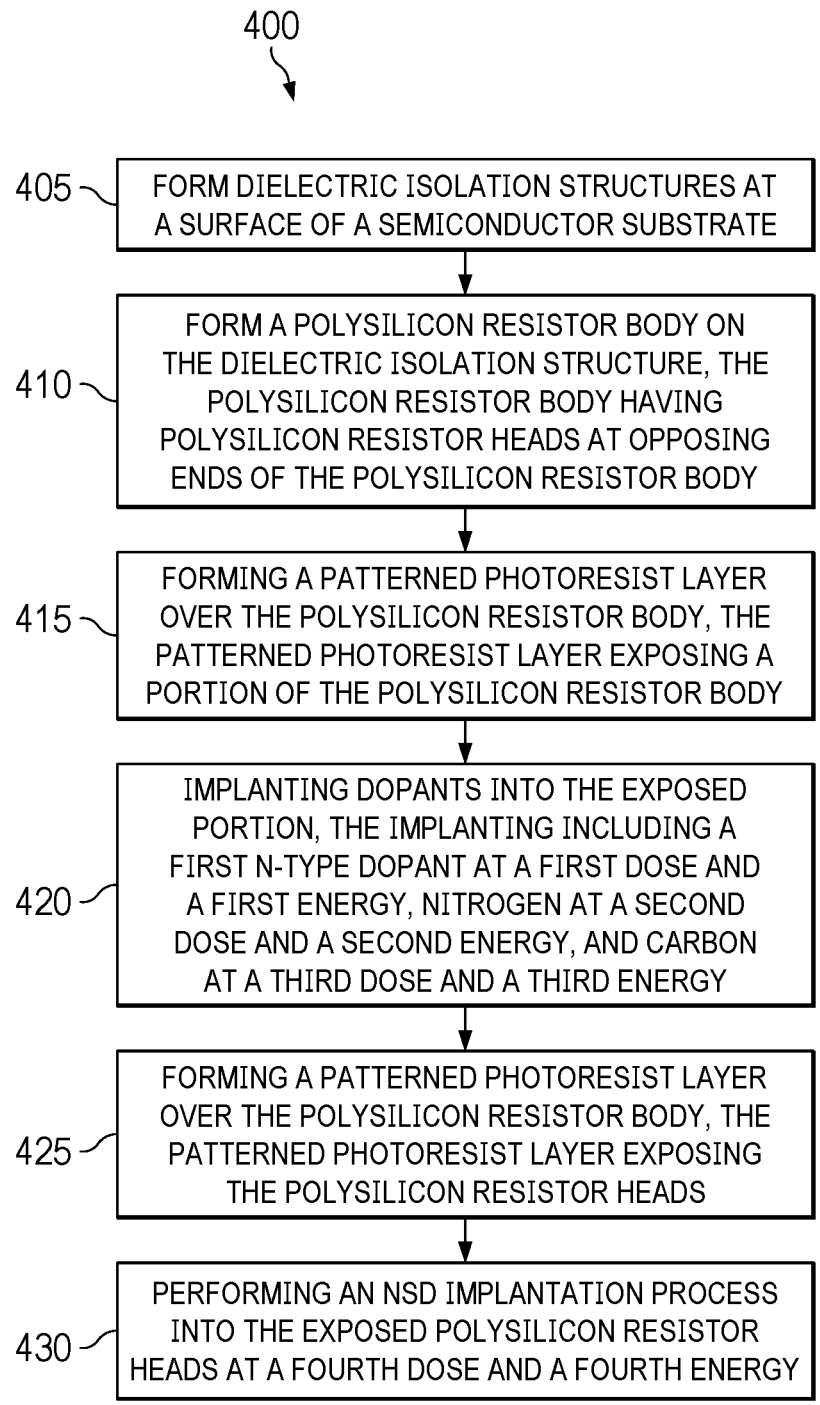
FIG. 4 depicts a flowchart of a method of fabricating an integrated circuit according to an implementation of the disclosure.

FIG. 4 depicts a flowchart of a method 400 of fabricating an integrated circuit. The method 400 begins with forming dielectric structures (e.g. dielectric isolation structure 108 in FIG. 1D) at a surface of a semiconductor substrate (405). In one implementation, the dielectric structures, which may be formed by conventional methods, are STI structures. A polysilicon resistor body (e.g., 118B in FIG. 1D) is formed on the dielectric structure, with polysilicon resistor heads (e.g., 118H in FIG. 1D) at opposing ends of the polysilicon resistor body (410). The polysilicon resistor body may be formed by depositing a polysilicon layer (e.g., 112 in FIG. 1A) over the top surface of the substrate (e.g., 110 in FIG. 1A), patterning a photoresist layer (e.g., 114 in FIG. 1A) over the polysilicon layer to protect regions where the resistors are desired, and performing an etch process (e.g., 116 in FIG. 1A) on the polysilicon layer.

A patterned photoresist layer (e.g., 124 in FIG. 1B) may be formed over the polysilicon resistor bodies, with the patterned photoresist layer exposing portions of the polysilicon resistor bodies (415). As noted previously, dilution doping may be used to vary the level of dopant in the polysilicon body. Additional resistors that are not UHRES resistors may also be patterned to contain exposed portions. The patterned UHRES photoresist layer may be used to perform a implantation process (e.g., 126 in FIG. 1B) in which the implantation process implants a first N-type dopant (e.g., phosphorus or arsenic) at a first dose and a first energy, implants nitrogen at a second dose and a second energy, and implants carbon at a third dose and a third energy (420). In one implementation, the first N-type dopant may be phosphorus implanted at a dose between about 4.5 E14 cm$^{-2}$ to about 6.5 E14 cm$^{-2}$ and the first energy may be about 30 keV. In one implementation, the second dose of nitrogen may be about 1 E15 cm$^{-2}$ and the second energy may be about 20 keV. In one implementation, the third dose of carbon may be about 1 E15 cm$^{-2}$ to about 2 E15 cm$^{-2}$ and the third energy may be about 7 keV to about 12 keV. In some examples the nitrogen is implanted after the first N-type dopant, and the carbon is implanted after the nitrogen.

Following the implantation of the N-type dopant, the nitrogen and the carbon, the photoresist (e.g., 124 in FIG. 1B) is removed and a patterned photoresist layer (e.g., 128 in FIG. 1C) is formed over the polysilicon resistor body (425). The patterned photoresist layer will protect the polysilicon resistor body, while the polysilicon resistor heads are exposed. An NSD implantation process (e.g., 130 in FIG. 1C) is on exposed portions of the polysilicon resistor heads through the openings in the NSD photoresist layer (430). The NSD implantation process implants a second N-type dopant (e.g., phosphorus or arsenic) at a fourth dose and a fourth energy. In one implementation, the NSD implantation process again uses phosphorus.

Although not specifically shown in the method 400, processing of the integrated circuit may proceed with the formation of the silicide blocking layer (e.g., 142 in FIG. 1D) and the formation of silicide (not shown) on contact regions. A dielectric layer (e.g., 140 in FIG. 1D) may be deposited, contacts (e.g., 136 in FIG. 1D) may be formed through the dielectric layer, and horizontal metal interconnects (e.g., 138 in FIG. 1D) may be formed in a metal and patterned.

Applicants have disclosed an integrated circuit that contains a UHRES resistor that uses phosphorus as a dopant, rather than boron and a method of fabricating the integrated circuit. In addition to phosphorus, the UHRES implantation process also provides nitrogen and carbon, which provide better matching across the wafer and between batches and a better temperature coefficient of resistance. Each element in the UHRES implantation process is implanted separately and at an individual dosage and energy. The UHRES implantation process may be shared with other polysilicon resistors to provide similar benefits.

Although various implementations have been shown and described in detail, the claims are not limited to any particular implementation or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the present claims. Accordingly, those skilled in the art will recognize that the exemplary implementations described herein can be practiced with various modifications and alterations within the spirit and scope of the claims appended below.

What is claimed is:

1. A method of fabricating an integrated circuit, the method comprising:
   forming a polysilicon resistor body over a semiconductor substrate; and
   implanting an N-type dopant, nitrogen and carbon into the polysilicon resistor body, wherein:
     the N-type dopant is implanted into the polysilicon resistor body with no tilt;
     the nitrogen is implanted into the polysilicon resistor body with no tilt; and the carbon is implanted into the polysilicon resistor body using a tilt axis having a tilt angle of about nine degrees and a rotation of a long axis of the polysilicon resistor body about four degrees with respect to the tilt axis.

2. The method as recited in claim 1, further comprising first implanting the N-type dopant, then implanting the nitrogen, and then implanting the carbon.

3. The method as recited in claim 1, wherein the N-type dopant is phosphorous.

4. The method as recited in claim 1, wherein the N-type dopant is implanted at a dose of about 6.5E14 $cm^{-2}$ and an energy of about 30 keV.

5. The method as recited in claim 1, wherein the nitrogen is implanted at a dose of about 1.0E15 $cm^{-2}$ and an energy of about 20 keV.

6. The method as recited in claim 1 wherein the carbon is implanted at a dose of about 2.0E15 $cm^{-2}$ and an energy of about 7 keV.

7. The method as recited in claim 1 wherein implanting nitrogen, carbon and the N-type dopant includes first implanting phosphorus with a dose of about 6.5E14 $cm^{-2}$ at an energy of about 30 keV, then implanting the nitrogen with a dose of about 1.0E15 $cm^{-2}$ at an energy of about 20 keV, and then implanted the carbon at a dose of about 2.0E15 $cm^{-2}$ and an energy of about 7 keV.

8. The method as recited in claim 1, wherein an implant dose of the nitrogen is about twice an implant dose of the N-type dopant, and an implant dose of the carbon is about three times the implant dose of the N-type dopant.

9. The method as recited in claim 1, wherein the polysilicon resistor body is formed on a dielectric isolation structure.

10. The method as recited in claim 9, wherein the dielectric isolation structure is a shallow trench isolation structure.

11. The method as recited in claim 1, wherein the polysilicon resistor body has a sheet resistance greater than 5 k$\Omega$/□ after the implanting.

12. A method of fabricating an integrated circuit, the method comprising:
    forming a polysilicon resistor body over a semiconductor substrate;
    implanting phosphorus with a dose of about 6.5E14 $cm^{-2}$ at an energy of about 30 keV with no tilt;
    implanting nitrogen with a dose of about 1.0E15 $cm^{-2}$ at an energy of about 20 keV with no tilt; and
    implanted carbon at a dose of about 2.0E15 $cm^{-2}$ and an energy of about 7 keV using a tilt angle of about nine degrees and a rotation of a long axis of the polysilicon resistor body about four degrees with respect to the tilt axis.

13. The method as recited in claim 12, wherein the nitrogen is implanted after the phosphorous and the carbon is implanted after the nitrogen.

14. The method as recited in claim 12, further comprising conductively connecting a terminal of the resistor body to a terminal of a transistor located in or over the semiconductor substrate.

15. The method as recited in claim 12, wherein the polysilicon resistor body is formed on a Local Oxidation of Silicon (LOCOS) structure.

16. A method of fabricating an integrated circuit, the method comprising:
    forming a dielectric layer over a semiconductor substrate;
    forming a polysilicon resistor body over the dielectric layer;
    implanting an N-type dopant into the polysilicon resistor body with no tilt;
    implanting nitrogen into the polysilicon resistor body with no tilt; and
    implanting carbon into the polysilicon resistor body using a tilt axis having a tilt angle of about nine degrees and a rotation of a long axis of the polysilicon resistor body about four degrees with respect to the tilt axis.

17. The method as recited in claim 16, wherein:
    the N-type dopant comprises phosphorous implanted with a dose of about 6.5E14 $cm^{-2}$ at an energy of about 30 keV;
    the nitrogen is implanted with a dose of about 1.0E15 $cm^{-2}$ at an energy of about 20 keV; and
    the carbon is implanted at a dose of about 2.0E15 $cm^{-2}$ and an energy of about 7 keV.

18. The method as recited in claim 16, wherein:
    the N-type dopant is implanted with a first dose;
    the nitrogen is implanted with a second dose about three times the first dose; and
    the carbon is implanted at a dose of about 1.5 times the first dose.

19. The method as recited in claim 16, wherein the dielectric layer is a shallow trench isolation (STI) structure.

20. The method as recited in claim 16, further comprising conductively connecting a terminal of the resistor body to a terminal of a transistor located in or over the semiconductor substrate.

* * * * *